United States Patent [19]

Streifer et al.

[11] 4,077,019

[45] Feb. 28, 1978

[54] TRANSVERSE MODE CONTROL IN DOUBLE-HETEROSTRUCTURE LASERS UTILIZING SUBSTRATE LOSS

[75] Inventors: William Streifer, Palo Alto; Donald R. Scifres; Robert D. Burnham, both of Los Altos, all of Calif.

[73] Assignee: Xerox Corporation, Stamford, Conn.

[21] Appl. No.: 655,323

[22] Filed: Jan. 5, 1976

[51] Int. Cl.$^2$ ............................................. H01S 3/19
[52] U.S. Cl. .............................. 331/94.5 H; 357/18
[58] Field of Search ................... 330/4.3; 331/94.5 H; 357/16, 18

[56] References Cited

U.S. PATENT DOCUMENTS

| 3,733,561 | 5/1973 | Hayashi | 331/94.5 H |
| 3,740,661 | 6/1973 | D'Asaro | 331/94.5 H |
| 3,838,359 | 9/1974 | Hakki et al. | 331/94.5 H |

OTHER PUBLICATIONS

Lockwood et al., IEEE J. of Quantum Electronics, vol. QB-10, No. 7, July 1976, pp. 567-569.

Primary Examiner—Stanley D. Miller, Jr.
Assistant Examiner—James W. Davie
Attorney, Agent, or Firm—M. J. Colitz, Jr.; T. J. Anderson; L. Zalman

[57] ABSTRACT

A heterojunction diode laser which achieves transverse mode control by providing adjacent to the active region layer of the laser a layer having a thickness substantially less than the thickness of the active region layer and of a material having a bandgap higher than the bandgap of the material of the active region layer. All transverse modes have increased penetration into a lossy substrate via the thin layer with the loss being least for the lowest order mode such that only the lowest order mode can be made to lase at low pumping current levels.

4 Claims, 4 Drawing Figures

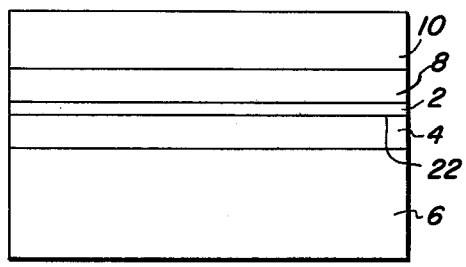
(PRIOR ART)
FIG. 1
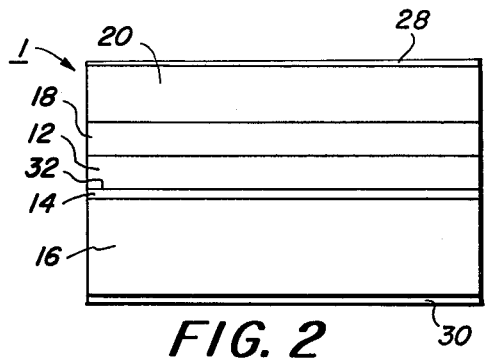
FIG. 2
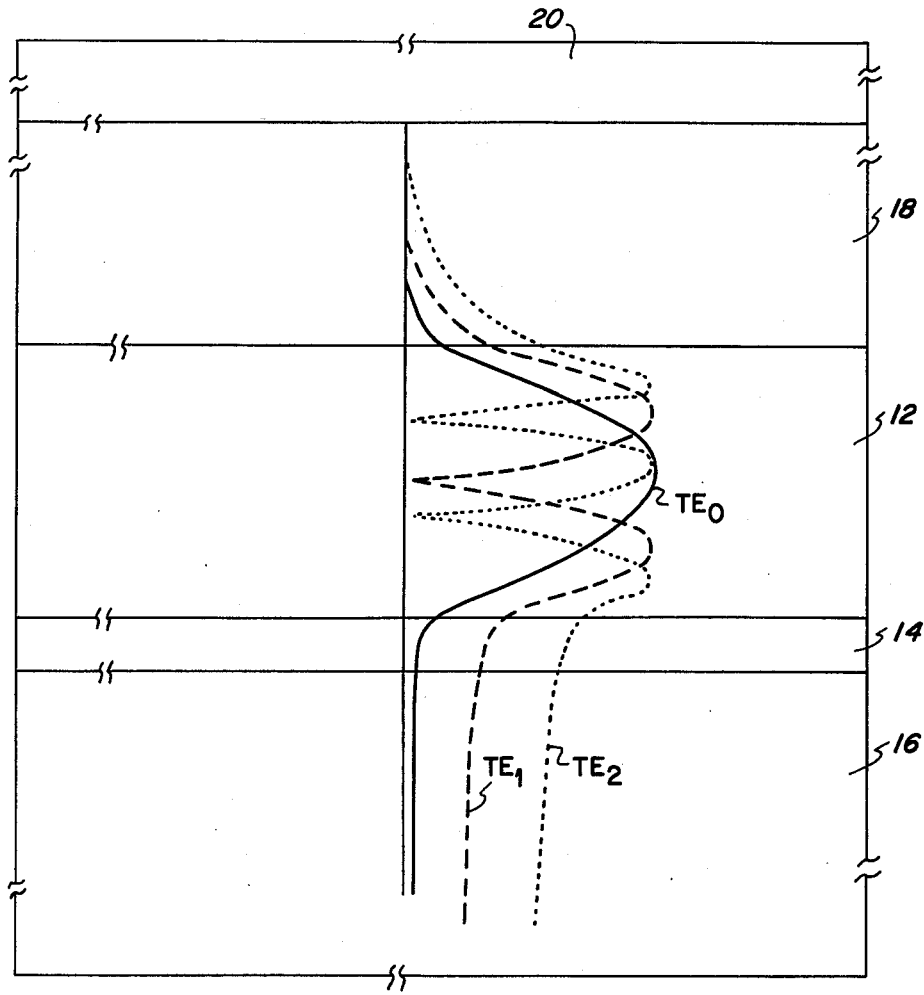
FIG. 3 → INTENSITY

TRANSVERSE MODE CONTROL IN DOUBLE-HETEROSTRUCTURE LASERS UTILIZING SUBSTRATE LOSS

BACKGROUND OF THE INVENTION

Double heterojunction diode lasers conventionally consist of an active region layer sandwiched between two relatively thick layers of a material having a bandgap higher than the bandgap of the active region layer material. The active region layer and the sandwiching layers are doped such that one of the heterojunctions is a rectifying junction, with forward bias of the rectifying junction providing carrier injection into the active region layer to provide, upon carrier recombination, the generation of radiation and with the sandwiching layers providing carrier and radiation confinement. If the active region layer of this conventional laser is relatively thick (1.0–2.0 microns) many transverse optical fields (transverse modes) are allowed to propagate within the active region layer. Generally, this multiple transverse mode behavior is undesirable, in part because the resulting output radiation lacks coherency and collimation, and also because the relative power in each mode is uncontrolled.

To obtain transverse mode control (TMC) the active regions of some double heterojunction lasers are made thin, for example, between 0.1 microns and 0.5 microns. This active layer thickness allows only one transverse mode to "fit" into the laser waveguide. These thin active region lasers have the disadvantage that the total power they generate is limited first because of the small active volume of the active region layer available for carrier recombination and radiation production and second because of the thick sandwiching layers required on both sides of the active region layer. Thick sandwiching layers are necessary to confine the light with little loss when the active region layer is thin but these sandwiching layers generally have low heat conductivity which prevents carrier recombination and absorption produced heat from being dissipated readily from the active region layer.

Lasers with thin active region layers also produce an output beam having a greater divergence than the output beam from lasers with a thicker active region layer. By "divergence" it is meant that the beam spreads out as it moves away from the emitting end of the laser. In many applications of semiconductor lasers the emitted beam is directed at a target and it is desirable that the beam impinge upon the target as a spot of controlled area. Therefore, it is desirable that the emitted beam have a minimum of divergence so as to simplify the lens system which may be needed in the optical system between the laser and the target.

One prior art semiconductor double heterojunction diode laser purportedly achieves low emitted beam divergence by making the bandgap energy difference at one heterojunction greater by a substantial amount than the bandgap energy difference at the other heterojunction, with a five to one difference being taught. Specifically, the difference is achieved by varying the composition of the thick sandwiching layers such that one of these layers has a bandgap lower by a substantial amount than the bandgap of the other sandwiching layer. For example, the low bandgap sandwiching layer can be $Ga_{0.97}Al_{0.03}As$ and the high bandgap sandwiching layer can be $Ga_{0.9}Al_{0.1}As$. It is believed that the mismatch in heterojunction bandgap energy difference shifts the transverse mode patterns such that they are assymetrical with respect to the center of the active region layer such that the normalized area of the lowest order mode is greater than the normalized area of the other modes. Since the normalized area of a laser mode is a direct function of the gain seen by that mode, the mismatched energy difference at the heterojunctions will encourage lowest order mode operation and accordingly low beam divergence.

Providing lowest order mode operation and low beam divergence by heterojunction band gap energy difference mismatch has several disadvantages. First, the lower band gap sandwiching layer substantially decreases current confinement. Second, the thick sandwiching layers exhibit poor heat conductivity which prevents carrier recombination and absorption produced heat energy from leaving the active region layer.

OBJECTS OF THE INVENTION

It is an object of the present invention to provide a laser having improved transverse mode control.

It is a further object of the present invention to provide a laser having reduced output beam divergence.

It is a still further object of the present invention to provide a laser having increased heat dissipating capabilities.

SUMMARY OF THE INVENTION

In accordance with the invention, transverse mode control and beam divergence control are achieved by a heterojunction diode laser having a relatively thick active region layer and at least one relatively thin sandwiching layer. With this structure, several transverse modes can exist, but each transverse mode leaks power through the thin sandwiching layer to a lossy substrate, with the amount of power lost increasing as the transverse mode number increases. Thus, only the lowest order transverse mode will actually lase at low pumping current levels. The thickness of the thin sandwiching layer is selected so that the threshold gain increase of the lowest order transverse mode is negligable. Other advantages are the ability to operate at high power output because of a thick active region layer, good heat conduction away from the active region layer because the sandwiching layer or layers allow heat to pass readily to a more thermally conductive substrate or supersubstrate layer, and good output beam collimation.

BRIEF DESCRIPTION OF THE DRAWINGS

FIG. 1 is an end view of a laser of the prior art.

FIG. 2 is an end view of a laser in accordance with the present invention.

FIG. 3 shows some transverse mode intensity patterns of the laser of FIG. 2.

DETAILED DESCRIPTION OF THE INVENTION

Figure 4:
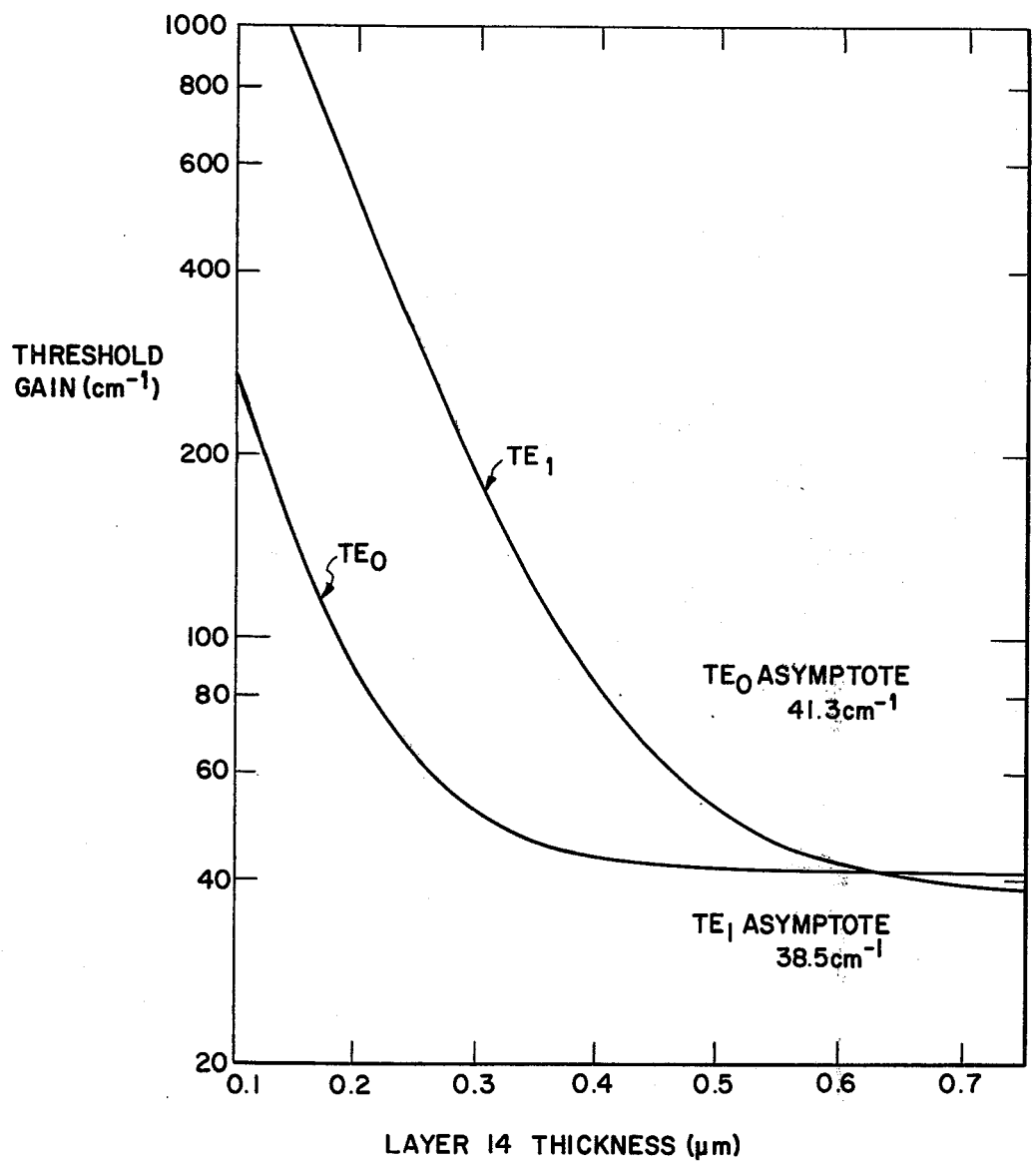
FIG. 4 is a graph showing threshold gain for the $TE_0$ the $TE_1$ modes in a particular laser.

Referring initially to FIG. 1, there is shown the structure of a conventional prior art dual heterojunction diode laser with the laser consisting of an active region layer 2, a first sandwiching or waveguiding layer 4 between layer 2 and substrate 6, and a second sandwiching or waveguiding layer 8 between layer 2 and supersubstrate contact-facilitating layer 10. The material (or materials) of layers 4 and 8 have a higher band gap than the material of layer 2 such that carrier and optical confinement are achieved. For example, layer 2 can be GaAs, layers 4 and 8 can be $Ga_{1-x}Al_xAs$ ($0.1 \leq x \leq 0.5$), and substrate 6 and supersubstrate layer 10 also can be GaAs. Substrate 6 and layer 4 are doped n-type and layers 2, 8 and 10 are doped p-type such that a rectifying heterojunction 22 is provided at the interface of layers 2 and 4, with a non-rectifying heterojunction provided at the interface of layers 2 and 8, layers 8 and 10, and layer 4 and substrate 6. Upon a forward bias condition, carriers (electrons and holes) are injected into, and confined within, active region layer 2 to generate radiation upon carrier recombination.

In an attempt to achieve single transverse mode operation, layer 2 is made thin, that is, between 0.1 microns and 0.5 microns. On the other hand, layers 4 and 8 are made relatively thick, that is, greater than 1.0 microns, to prevent loss of power in both lossy substrate 6 and lossy superstrate layer 10. Due to the thickness of layer 2, beam divergence is relatively large.

Referring now to FIG. 2, there is shown a laser 1 in accordance with the present invention. Like the conventional laser described, the active region layer 12 is bordered on one side by guiding layer 14 and substrate 16 and is bordered on the other side by guiding layer 18 and superstrate layer 20. Also like the described conventional laser, the layer 14 and the substrate 16 can be n-type and layers 12, 18 and 20 can be p-type such that a rectifying heterojunction 32 exists at the interface of layers 12 and 14. The material of layers 14 and 18 have a higher band gap than the material of layer 12 such that carrier and optical confinement are achieved. For example, layer 12 can be GaAs, with layers 14 and 18 being $Ga_{1-x}Al_xAs$ ($0.15 \leq x \leq 0.5$), and with substrate 16 and supersubstrate layer 20 also being GaAs which is more radiation lossy than GaAlAs and more heat conductive than GaAlAs.

In accordance with the invention, layer 14 is made relatively thin such that the active region layer 12 is very close to the lossy substrate 16. With this configuration, a substantial portion of the higher order transverse modes extend through the layer 14 and into the lossy substrate 16, but only a small portion of the lowest order transverse mode $TE_0$ extends into the lossy substrate 16. Each transverse mode experiences an energy loss portional to its relative energy in the substrate 16 either because the substrate 16 readily absorbs optical radiation energy or if the substrate does not absorb then because the energy is radiated away. Thus, with only a small portion of the energy of the lowest order transverse mode in the substrate 16, the energy loss of the lowest order transverse mode is negligible but, with a substantial portion of the radiation energy of the higher order transverse modes in the substrate 16, the higher order transverse mode losses are quite significant. Thus, only the lowest order transverse mode ($TE_0$) will lase at low pump current levels.

Referring to FIG. 3, there is shown the energy distributions of the lowest or zero order transverse mode $TE_0$, the first order transverse electric mode ($TE_1$) and the second order transverse electric mode $TE_2$ within the laser 1 of FIG. 2. As noted, the zero order transverse mode has very little penetration through thin layer 14 into the lossy substrate 16 and hence experiences an insignificant radiation and/or absorption energy loss. On the other hand, the first order transverse mode has significant penetration into the lossy substrate 16 and experiences a significant energy loss. The second order transverse mode has even more penetration into the lossy substrate 16 than the first order transverse mode and hence also experiences significant energy loss. If modes greater than the second order transverse mode (not shown) are allowed by the width of the active region 12, they experience even more loss and hence only the lowest or zero order transverse mode $TE_0$ will lase at low pump current levels.

As described, transverse mode control is achieved because all higher order transverse modes have increased penetration through very thin, relatively non lossy layer 14 into the lossy substrate 16 and therefore exhibit increased energy or radiation losses in the substrate 16. The thickness of layer 14, required to achieve penetration of higher order transverse modes into the substrate, depends on the composition of layers 14 and 18 and the thickness of layer 12. For example, in a GaAs: $Ga_{1-x}Al_xAs$ double heterostructure laser with approximately 30% Al in layers 14 and 18, and layer 12 at least 0.8um thick, layer 14 would have to be less than 0.5um thick. With this small thickness of layer 14, better heat conduction away from the active layer 12 is normally achieved since layer 14 is of a material which conducts heat less well than the material of substrate 16.

The radiation loss of the higher order transverse modes allows single, lowest order transverse mode operation even with a thick active region layer. In this regard, as described previously, active region layer 12 can have a thickness of at least 0.8 microns when layer 14 has a thickness of less than 0.5 microns. The increased thickness of the active region layer allows the laser 1 to have higher power output than that of conventional lasers with thin active region layers and provides for decreased beam divergence since the output beam is emitted over a larger area than with conventional thin active region layer lasers.

Reference is now made to FIG. 4 which is a plot of the $TE_0$ mode and the $TE_1$ mode threshold gains verses the thickness of layer 14 in microns for the diode described previously. The asymptotic values are the threshold gains for a very thick layer 14 and for that structure the plot of FIG. 4 indicates that the $TE_1$ mode will lase at a lower pump current than the $TE_0$ mode. However, with decreasing thickness of layer 14, the threshold gain increases quite dramatically but with the increase for the $TE_0$ mode occurring significantly below that for the $TE_1$ mode and other higher order transverse modes (not shown). Thus, for layer 14 thickness of less than 0.5 microns there exists substantially discrimination between the $TE_0$ and $TE_1$ mode thresholds. Furthermore, in the thickness range less than 0.5 microns, the $TE_0$ mode threshold changes only slightly from its asymptotic value. Specifically, for a layer 14 thickness of 0.4 microns, the $TE_0$ mode threshold increase is only about 5 percent over the asymptotic value whereas the $TE_1$ mode threshold increase is about 110 percent over the asymptotic value. Accordingly, with the layer 14 having a thickness of less than 0.5 microns, the $TE_0$ mode can achieve threshold gain at pump current levels below which any of the higher order transverse modes can achieve gain and hence the laser 1 of FIG. 2 can be made to lase only in the zero order transverse mode.

The energy loss of the higher order transverse modes can be increased still more by having the layer 18 of a thickness in the range of the thickness of layer 14. With layers 14 and 18 both thin, the higher order transverse modes have substantial penetration into both substrate 16 and superstrate 20 and hence have substantial loss in both substrate 16 and superstrate 20, while the zero order transverse mode has little penetration into substrate 16 and superstrate 20 and hence little loss in those relatively lossy regions.

The feedback mechanism required to provide gain for the laser 1 of FIG. 2 is not critical. Feedback can be achieved by using discrete end reflectors on the surface of layer 12 or by means of distributed feedback provided by a periodic corrugation of one of the heterojunctions of the laser of FIG. 2. The laser of FIG. 2 can be made by a conventional process. Specifically, the laser of FIG. 2 can be made by growing layers 14, 12, 18 and 20 sequentially in an epitaxial growth furnace from properly doped melts of the materials of those layers. Molecular beam epitaxy also can be used to form layers 14, 12, 18 and 20 on substrate 16. If the laser uses discrete end mirrors, the mirrors are affixed after the layer growth. If distributed feedback is provided as a gain mechanism, the periodic corrugation could be formed on a surface of substrate 16 prior to the formation of layers 14, 12, 18 and 20 on that surface. Electrodes 28 and 30 provide a means for forward biasing rectifying heterojunction 32.

What is claimed is:

1. An electrically pumped, solid-state, diode laser comprising:
    a semiconductor body including a radiation lossy portion and a plurality of layers adjacent said radiation lossy portion, one of said layers being an active region layer;
    a rectifying junction within said body, said rectifying junction bordering said active region layer;
    means for forward biasing said rectifying junction, carriers injected across said junction upon sufficient forward biasing of said junction undergoing radiative recombination in said active region layer to generate stimulated coherent radiation including ordered transverse electric modes;
    said active region layer being separated from said radiation lossy portion of said body by at least another of said plurality of layers, said another layer being of a material having a bandgap higher than the bandgap of the material of said active region layer,
    said active region layer being at least 0.8 micron thick and said another layer being not greater than about 0.5 micron thick, whereby the higher order transverse electric modes of said ordered transverse electric modes have substantial penetration into said radiation lossy portion of said body and the lowest order transverse electric mode of said ordered transverse electric modes has little penetration into said radiation lossy portion of said body such that the radiation losses of the higher order transverse electric modes are substantially greater than the radiation losses of the lowest order transverse electric mode providing lowest order transverse electric mode operation by the laser.

2. An electrically pumped, solid-state, diode laser comprising:
    a semiconductor body including a radiation lossy portion and a plurality of layers adjacent said radiation lossy portion,
    one of said layers being the active gain region layer,
    a rectifying junction within said body at a boundary of said active region layer, and
    means for forward biasing said rectifying junction, carriers injected across said junction upon sufficient forward biasing of said junction undergoing radiative recombination in said active gain region to generate stimulated coherent radiation including ordered transverse electric modes,
    said active gain region layer being separated from said radiation lossy portion of said body by another thin layer of said plurality of layers, said radiation lossy portion being substantially thicker than said active gain region layer whereby the higher order transverse electric modes of said ordered transverse electric modes have substantial penetration into said radiation lossy portion of said body and the lowest order transverse electric mode of said ordered transverse electric modes has little penetration into said radiation lossy portion of said body such that the radiation losses of the higher order transverse electric modes are substantially greater than the radiation losses of the lowest order transverse electric mode and lowest order transverse electric mode operation is provided by the laser.

3. An electrically pumped, solid-state, diode laser comprising:
    a semiconductor body including a radiation lossy portion and a plurality of layers adjacent said radiation lossy portion,
    one of said layers being the active gain region layer, said active gain region layer being homogeneous,
    a rectifying junction within said body at a boundary of said active region layer, and
    means for forward biasing said rectifying junction, carriers injected across said junction upon sufficient forward biasing of said junction undergoing radiative recombination in said active gain region to generate stimulated coherent radiation including ordered transverse electric modes,
    said active gain region layer being separated from said radiation lossy portion of said body by another thin layer of said plurality of layers, said radiation lossy portion being substantially thicker than said active gain region layer whereby the higher order transverse electric modes of said ordered transverse electric modes have substantial penetration into said radiation lossy portion of said body and the lowest order transverse electric mode of said ordered transverse electric modes has little penetration into said radiation lossy portion of said body such that the radiation losses of the higher order transverse electric modes are substantially greater than the radiation losses of the lowest order transverse electric mode providing lowest order transverse electric mode operation by the laser.

4. An electrically pumped, solid-state, diode laser comprising:
    a semiconductor body including a radiation lossy portion and a plurality of layers adjacent said radiation lossy portion,
    one of said layers being the active gain region layer, said active gain region layer being homogeneous,
    a rectifying junction within said body at a boundary of said active region layer, and
    means for forward biasing said rectifying junction, carriers injected across said junction upon sufficient forward biasing of said junction undergoing radiative recombination in said active gain region to generate stimulated coherent radiation including ordered transverse electric modes,
    said active gain region layer being separated from said radiation lossy portion of said body by another layer of said plurality of layers, said another layer being not greater than about 0.5 micron thick, and said radiation lossy portion being substantially thicker than said active gain region layer whereby the higher order transverse electric modes of said ordered transverse electric modes have substantial penetration into said radiation lossy portion of said body and the lowest order transverse electric mode of said ordered transverse electric modes has little penetration into said radiation lossy portion of said body such that the radiation losses of the higher order transverse electric modes are substantially greater than the radiation losses of the lowest order transverse electric mode and lowest order transverse electric mode operation is provided by the laser.

* * * * *